(12) United States Patent
Chen et al.

(10) Patent No.: US 7,272,161 B1
(45) Date of Patent: Sep. 18, 2007

(54) EPITAXIAL LAYER FOR LASER DIODE RIDGE PROTECTION

(75) Inventors: John Chen, Rowland Heights, CA (US); Robert Shih, Arcadia, CA (US); Chun Lei, Los Gatos, CA (US)

(73) Assignee: Finisar Corporation, Sunnyvale, CA (US)

( * ) Notice: Subject to any disclaimer, the term of this patent is extended or adjusted under 35 U.S.C. 154(b) by 291 days.

(21) Appl. No.: 10/670,876

(22) Filed: Sep. 25, 2003

(51) Int. Cl.
*H01S 3/08* (2006.01)

(52) U.S. Cl. .................................... 372/107; 372/43.01

(58) Field of Classification Search ................ 372/107, 372/43.01
See application file for complete search history.

(56) References Cited

U.S. PATENT DOCUMENTS

| | | | | |
|---|---|---|---|---|
| 4,835,783 | A * | 5/1989 | Suyama et al. | 372/46.01 |
| 5,399,885 | A * | 3/1995 | Thijs et al. | 257/95 |
| 6,888,870 | B2 * | 5/2005 | Makita et al. | 372/44.01 |

* cited by examiner

*Primary Examiner*—Michael Dung Nguyen
(74) *Attorney, Agent, or Firm*—Workman Nydegger

(57) ABSTRACT

A semiconductor laser formed from a semiconductor wafer has an active layer, at last two optical cladding layers, and a ridge waveguide. A ridge top surface of the ridge waveguide is deposited from a first surface of the semiconductor laser wafer by a first height. A plurality of semiconductor mesas are formed on the semiconductor laser wafer and have mesa top surfaces disposed from the first surface by a second height greater than the first height so that the plurality of semiconductor mesas shield the ridge waveguide from mechanical damage.

21 Claims, 8 Drawing Sheets

EPITAXIAL LAYER FOR LASER DIODE RIDGE PROTECTION

CROSS-REFERENCE TO RELATED APPLICATIONS

This application claims priority to and the benefit of U.S. Provisional Patent Application Ser. No. 60/614,618, filed Sep. 27, 2002, and entitled "Epitaxial Layer for Laser Diode Ridge Protection," the disclosure of which is incorporated herein by this reference.

BACKGROUND OF THE INVENTION

1. The Field of the Invention

The present invention relates generally to ridge waveguide semiconductor lasers, such as those used in optical transceivers. More particularly, the present invention is directed towards improving the yield and reliability of ridge waveguide lasers in an InP/AlInGaAs materials system.

2. The Relevant Technology

In the field of data transmission, one method of efficiently transporting data is through the use of fiber optics. Digital data is propagated through a fiber optic cable using light emitting diodes or lasers. Various types of lasers are used to generate the needed electromagnetic radiation to carry data along the optical fibers. For instance, semiconductor lasers, such as InP-based lasers, emitting at wavelengths between about 1.3 microns to 1.55 microns are of interest as laser transmitters for a variety of optical fiber applications, such as use in optical transceivers.

A semiconductor laser includes a waveguide to guide the optical mode. The waveguide is commonly formed by selecting an effective refractive index to be higher in a core region than surrounding regions. In the vertical direction relative to the axis of the as-grown epitaxial layers, the composition of the semiconductor layers can be grown to produce vertical wave guiding. In the lateral direction, there are several different structures that may be used to form a lateral waveguide. One structure that provides lateral waveguiding is a buried heterostructure. In a buried heterostructure laser, a first epitaxial process is used to grow the vertical laser structure. A narrow ridge is then etched down through the active region into the underlying layers. In a subsequent re-growth process, the sides of the ridge are embedded in a semiconductor having an average refractive index less than that of the ridge, thereby forming a lateral waveguide. This results in a substantially planar structure.

An alternative lateral waveguide structure is a ridge waveguide laser. A side view of an exemplary ridge waveguide laser is shown in FIG. 1. In a ridge waveguide laser 10, a single epitaxial growth process is commonly used to grow the vertical laser structure having a bottom cladding layer 14 deposited on a substrate 12, an active layer 16 deposited on bottom cladding layer 14, and a top cladding layer 18 deposited on active layer 16. A narrow ridge 20 is etched down through top cladding layer 18 typically to within several tenths of a micron above active layer 16, such as a multiple quantum well (MQW) active layer. The ridge 20 is commonly coated on its sides by a dielectric insulator 22, with a suitable metal contact layer 24 patterned to form a top contact to ridge 20.

Ridge waveguide lasers have the advantage of requiring fewer epitaxial growth steps compared with a buried heterostructure laser. However, a ridge waveguide laser has the disadvantage that it is more easily damaged during manufacturing than a comparable buried heterostructure laser. Since a manufacturing process for forming edge-emitting lasers requires considerable handling, non-planar nature of a ridge waveguide laser makes it more susceptible to mechanical damage than a comparable buried heterostructure laser. This is especially true since the manufacturing process commonly includes cleaving laser bars, dicing the laser bars into individual laser die, and then packaging individual die.

During the manufacturing process, even a small mechanical force imposed on a portion of a ridge may generate a high local pressure. In some cases, the ridge may be scratched, reducing yield. In other cases, mechanical damage is introduced into the ridge that shortens the lifetime of the lasers. While techniques exist to planarize ridge waveguide lasers with polymers, such as polyimide, these planarization techniques have the disadvantage of significantly increasing the number of fabrication steps. Additionally, this technique reduces yield, increases thermal resistance, and increases mechanical stress to the ridge and hence the ridge guide laser.

What is desired is an improved ridge guide laser structure with improved yield and reliability, while alleviating the problems identified with manufacturing the ridge guide laser.

BRIEF SUMMARY OF THE INVENTION

The present invention generally relates to methods and devices for shielding a ridge waveguide from mechanical damage during manufacture. Methods and devices are disclosed and described herein. The device may include a semiconductor die having a ridge waveguide. A ridge top surface of the ridge waveguide is deposited on a surface of the semiconductor die by a height. Surrounding the ridge waveguide are one or more semiconductor mesas that extend from a dielectric insulator layer of the waveguide. These mesas have a mesa top surface deposited on the surface of the semiconductor die by another height that is greater than the height between the ridge top surface and the surface of the semiconductor die. By so doing, the mesas shield the ridge waveguide from mechanical damage and improve yield and reliability of the manufactured ridge waveguide lasers, while alleviating the problems identified with manufacturing the ridge guide laser.

According to another configuration, the device includes a semiconductor die having a ridge waveguide. This waveguide is displaced between two channels. At least a portion of one of the two channels is filled with a metal contact layer that also surrounds the ridge waveguide. At least partially surrounding the ridge waveguide and the metal contact layer are one or more semiconductor mesas. These mesas have a mesa top surface deposited from a surface of the semiconductor die by a height that is greater than a height between a surface of metal contact layer and the surface of the semiconductor die. Again, the mesas shield the ridge waveguide from mechanical damage.

According to another configuration, a method is provided for forming the ridge waveguide having protective mesas that surround the waveguide. The method may include a step for forming a wafer having a semiconductor layer sequence that includes an active layer, a top clad layer, a doped layer, and a semiconductor protection layer grown on the doped layer. Following forming the wafer, the method may further include a step for forming one or more semiconductor mesas on the wafer. This may be achieved by masking the wafer to expose regions in which ridge lasers are to be formed and subsequently etching the protection layer in unmasked regions to form the one or more semiconductor mesas. After the mesas are formed, the method may include forming a ridge waveguide between the semiconductor mesas where the semiconductor mesas are positioned and have a surface height sufficiently greater than a surface height of the ridge waveguide to form an elevated surface shielding the ridge waveguide from mechanical damage.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The present invention generally relates to methods and devices for shielding a ridge waveguide from mechanical damage during manufacture. In one configuration, the present invention uses one or more semiconductor mesas to shield a ridge waveguide, where each semiconductor mesa is elevated relative to the ridge waveguide and is separate from an upper cladding layer of the ridge waveguide. By so doing, the mesas protect the ridge waveguide and improve yield and reliability of the manufactured ridge waveguide lasers, while alleviating the problems identified with manufactured the ridge guide laser.

Figure 1:
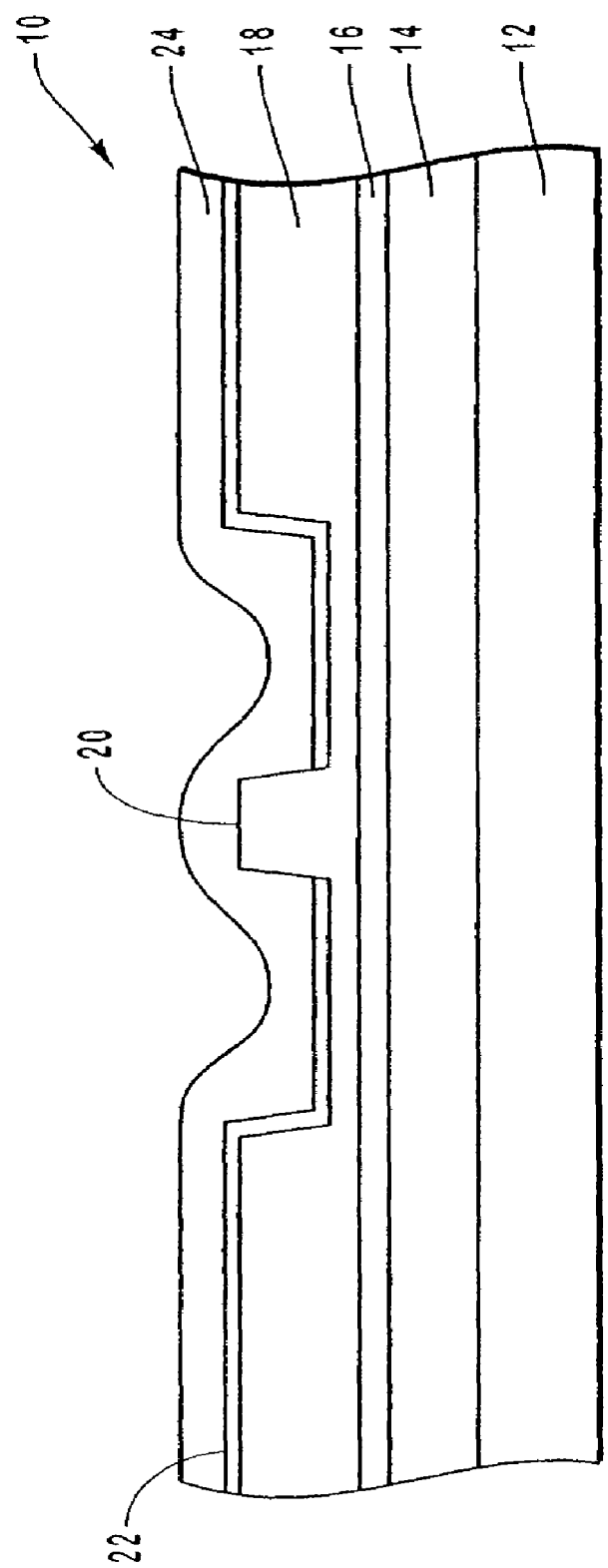
FIG. 1 is a side view of a ridge waveguide laser.
Figure 2:
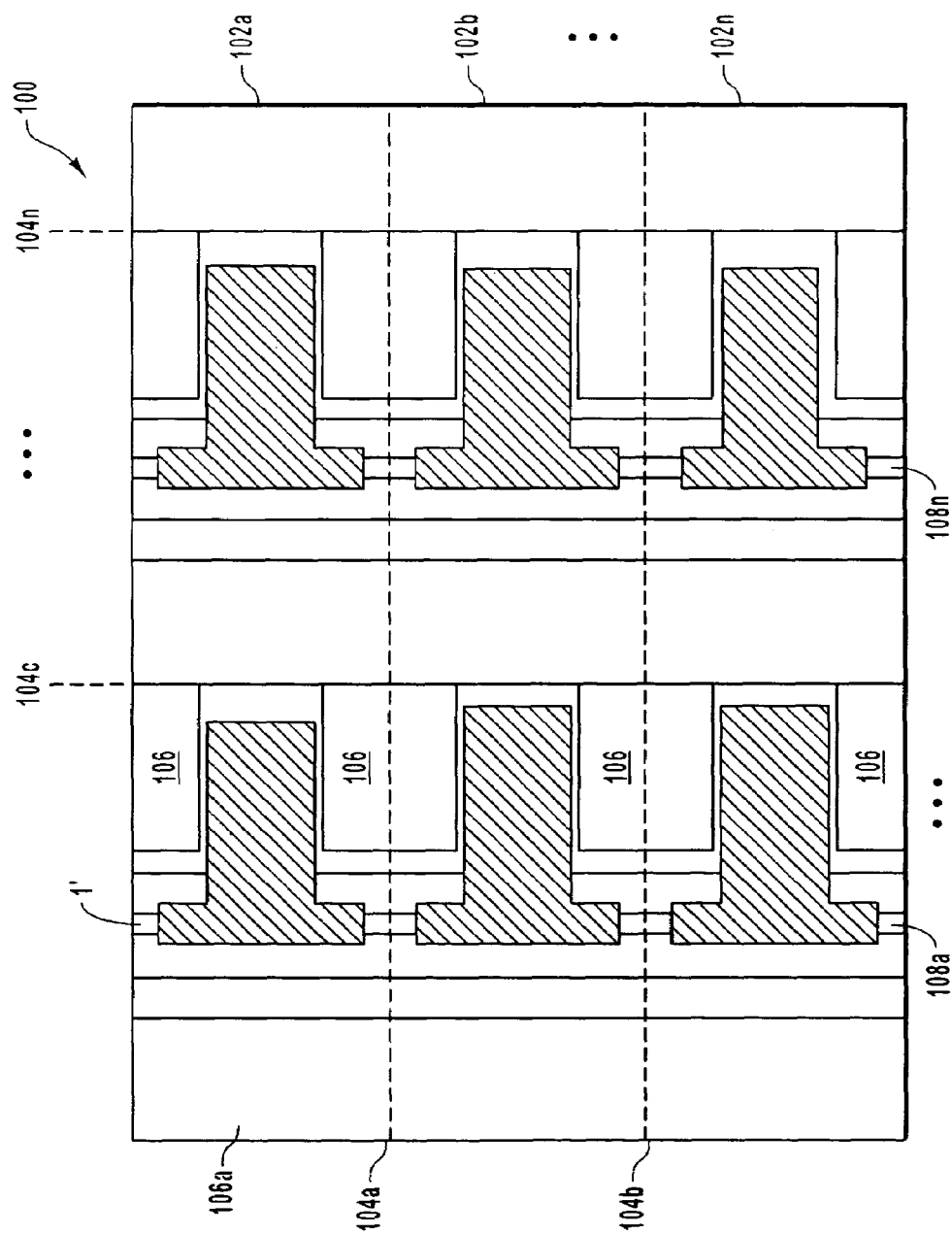
FIG. 2 is a top view of a portion of a wafer patterned with protective mesas in accordance with one embodiment of the present invention.

Referring to FIG. 2 illustrated is a portion of a wafer 100 having a plurality of ridge waveguide laser dies 102a–102n. These ridge waveguide laser dies 102a–102n may be separated one from another along dotted lines 104a–104n using cleaving technique that separates one laser die from one or more adjacent dies. One or more mesas 106 are formed on wafer 100 to protect one or more ridge waveguides 108a–108n during subsequent manufacture, including subsequent wafer-level, bar-level, and die-level processes. It is understood that during the manufacturing process adjacent ridge waveguide laser dies 102a–102n may share one or more mesas 106 and ridge waveguide 108a–108n. Following separation of the plurality of ridge waveguide laser dies 102a–102n, however, each ridge waveguide laser die 102a–102n includes a single ridge waveguide and one or more mesas 106.

Figure 3:
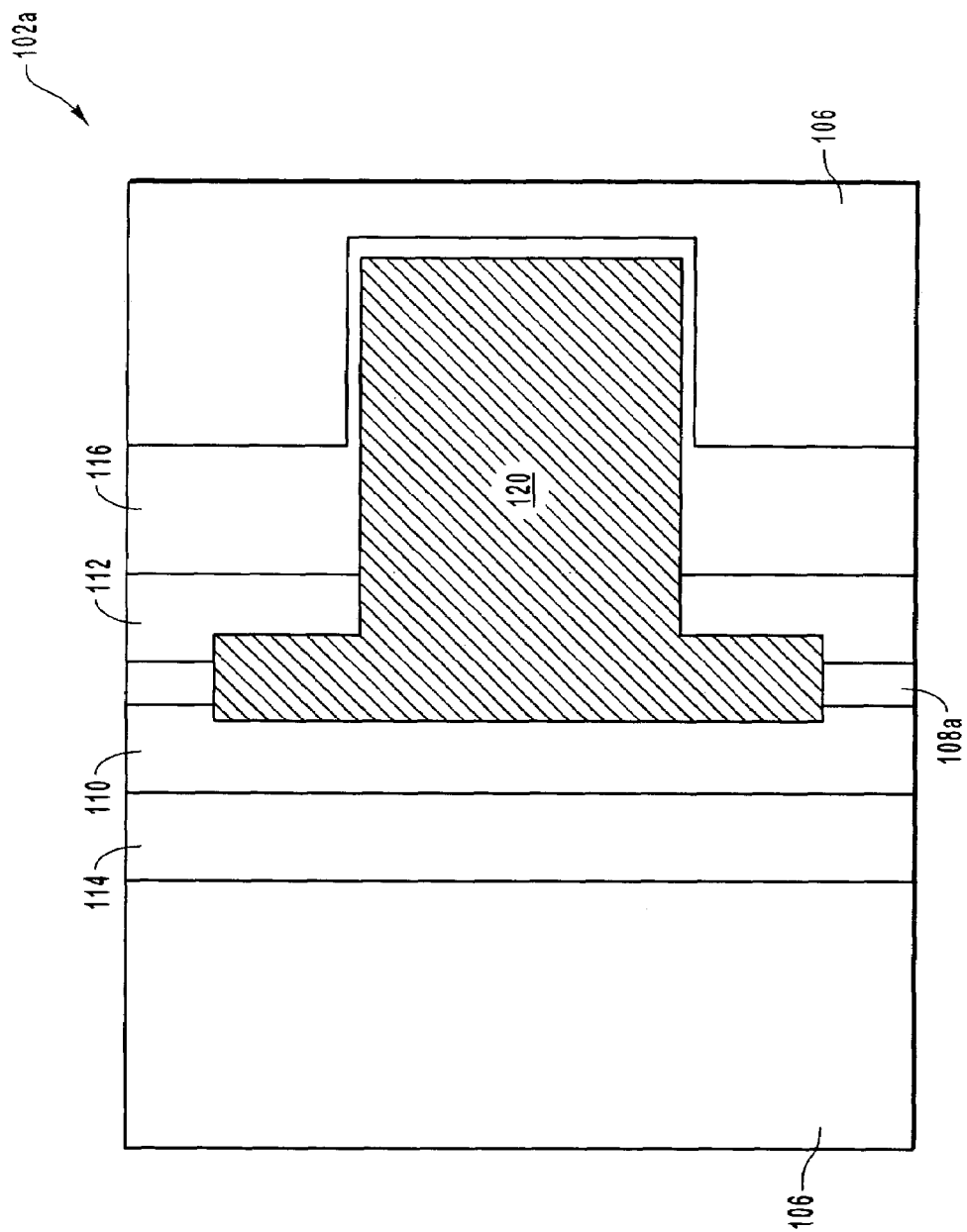
FIG. 3 is a top view of a laser die in accordance with one embodiment of the present invention.

Depicted in FIG. 3 is a single ridge waveguide die 102a, for instance. The ridge waveguide laser die 102a includes a ridge waveguide 108a, for instance, and one or more mesas 106. The ridge waveguide 108a provides lateral waveguiding of ridge waveguide laser die 102a, i.e., provides the waveguide through which propagates the laser energy.

Figure 4:
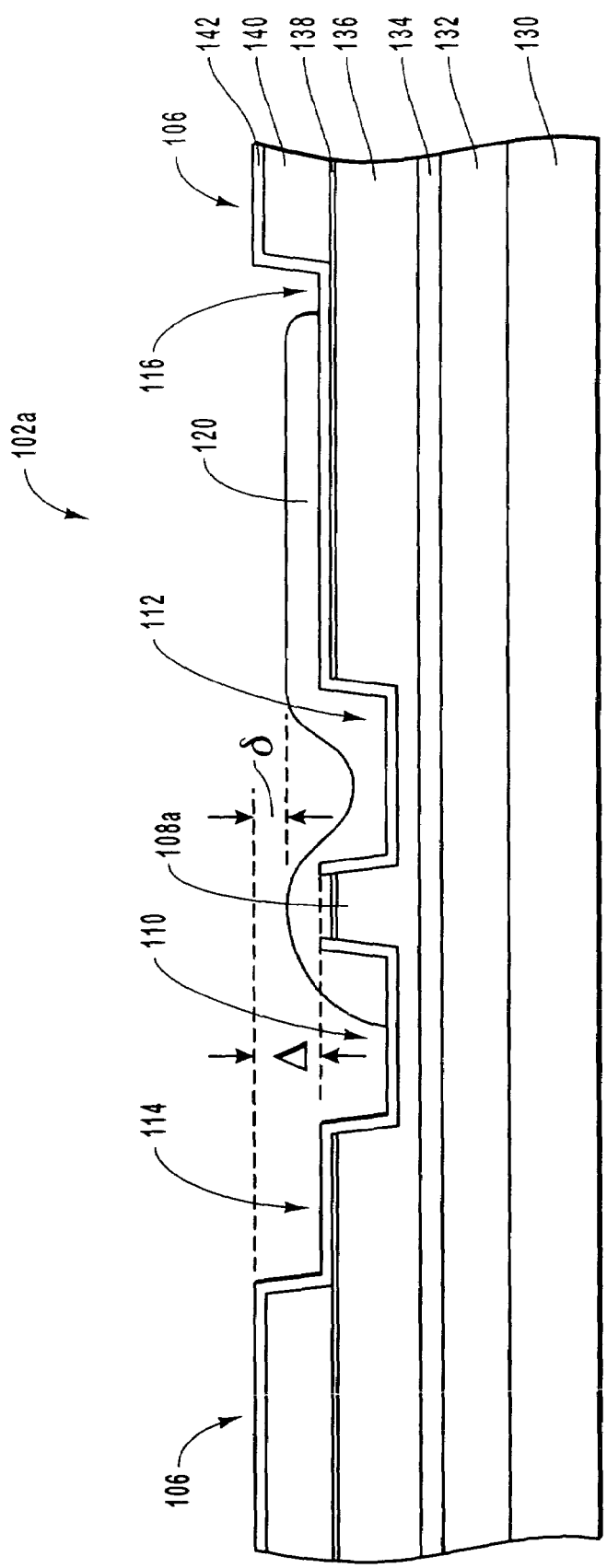
FIG. 4 is a cross-sectional view of the laser die of FIG. 3 in accordance with one embodiment of the present invention.

As illustrated in this exemplary configuration, and with reference to FIG. 4, formed between channels 110 and 112 is ridge waveguide 108a. The channel 110 transitions to a boundary region 114, while channel 112 transitions to boundary region 116. These boundary regions 114 and 116 in turn transition to mesas 106 that extend above the peak or top of ridge waveguide 108a. Extending from a portion of channel 110 toward boundary region 116 is a metal contact layer 120. The backside of ridge waveguide laser die 102a may also receive an additional metal contact layer in accordance with conventional semiconductor laser processing techniques. This contact layer 120 permits ohmic contact to be made to ridge waveguide 108a and may optionally have gaps proximate to lines 104a–104n (FIG. 2) where ridge waveguide laser dies 102a–102n separate one from another. These gaps are termed as "thick gold separation areas" and aid with the separation of adjacent dies during the manufacturing process. Stated another way, contact layer 120 extends substantially to a peripheral edge of each laser die 102a–102n, while stopping proximal to the peripheral edge.

With continued reference to FIG. 4, illustrated is a schematic representation of ridge waveguide 108a. As understood by those skilled in the art, ridge waveguide 108a is grown or fabricated with the layers indicated. Although reference is made here to a particular structure for an InP/AlInGaAs semiconductor laser, the present invention is also applicable to other semiconductor lasers. For instance, and not by way of limitations, an InP/InGaAsP semiconductor laser or a GaAs/InGaAs laser.

As shown, ridge waveguide 108a includes a substrate 130 upon which are grown a first cladding layer 132, an active layer 134, and a second cladding layer 136. Although reference is made to individual layers 132, 134, and 136, one skilled in the art will appreciate that each layer 132, 134, and 136 may include one or more layers.

The substrate 130 is an InP material. Cladding layers 132 and 136 may be fabricated from Indium Phosphide (InP) or some other III-V semiconductor material. The active layer 134 is a multiple quantum well (MQW) structure and may have an AlInGaAs MQW structure, an InGaAsP MQW structure, or an InGaAs MQW structure.

Grown on second cladding layer 136 is an etch stop layer 138 and a protection layer 140. The etch stop layer 138 acts as a contact layer. This etch stop layer 138 can be an InGaAs material. The protection layer 140 is deposited upon etch stop layer 138 and creates mesas 106 of ridge waveguide laser die 102a. For a ridge wave guide laser formed in the InP/AlInGaAs materials system on InP substrates, protection layer 140 may be an InP layer.

As may be seen from FIG. 4, a top surface of mesas 106 are elevated with respect to a top surface of ridge waveguide 108a. The ridge waveguide laser die 102a includes one or more mesas 106 grown upon etch stop layer 138. These mesas 106 form elevated surfaces that shield ridge waveguide 108a, i.e., increase the likelihood that the top surfaces of mesas 106 make first contact with mechanical objects or surfaces that come into contact with the die 102a during manufacture.

A recessed distance, Δ, between a top of mesas 106 and a top ridge waveguide 108a corresponds to the thickness of protection layer 140 of mesas 106, optionally along with an insulating film 142 deposited on mesas 106. A distance δ separates a top surface of contact layer 120 deposited on ridge waveguide 108a and a top surface of mesas 106. Contact layer 120, such as a thick gold layer, for example, commonly has a thickness between about 0.5 microns to 1.0 microns. As an illustrative example, if contact layer 120 has a thickness of about 0.8 microns, protection layer 140 may have a thickness greater than 0.8 microns to recess the top surface of the metallized ridge waveguide 108a, i.e., height of ridge waveguide 108a plus the portion of contact layer 120 deposited thereupon, by a distance, δ, with respect to mesas 106. In one embodiment, protection layer 140 has a thickness of between about 1.0 to 2.0 microns so that even comparatively thick metallized ridge waveguides 108a are recessed relative to the surface of mesas 106.

The selection of the thickness of protection layer 140 involves several tradeoffs. Increasing the thickness of protection layer 140 increases the potential height difference between mesas 106 and ridge waveguide 108a, improving the shielding effectiveness of ridge waveguide 108a. However, growing protection layer 140 more than a few microns thick increases the cost and difficulty of the epitaxial growth process. A protection layer 140 having a thickness of about 2.0 microns significantly improves yield while also being consistent with high quality semiconductor lasers, such as quantum well lasers emitting at a wavelength of about 1.3 microns. It will be understood that protection layer 140 may have any thickness between about 1.5 microns to about 3.0 microns. More generally, protection layer 140 may have any thickness that provides the desired protection to ridge waveguide 108a, provides the desired yield, while having a desired or selected difficulty and cost level for manufacturing ridge waveguide laser die of the present invention.

Figure 5:
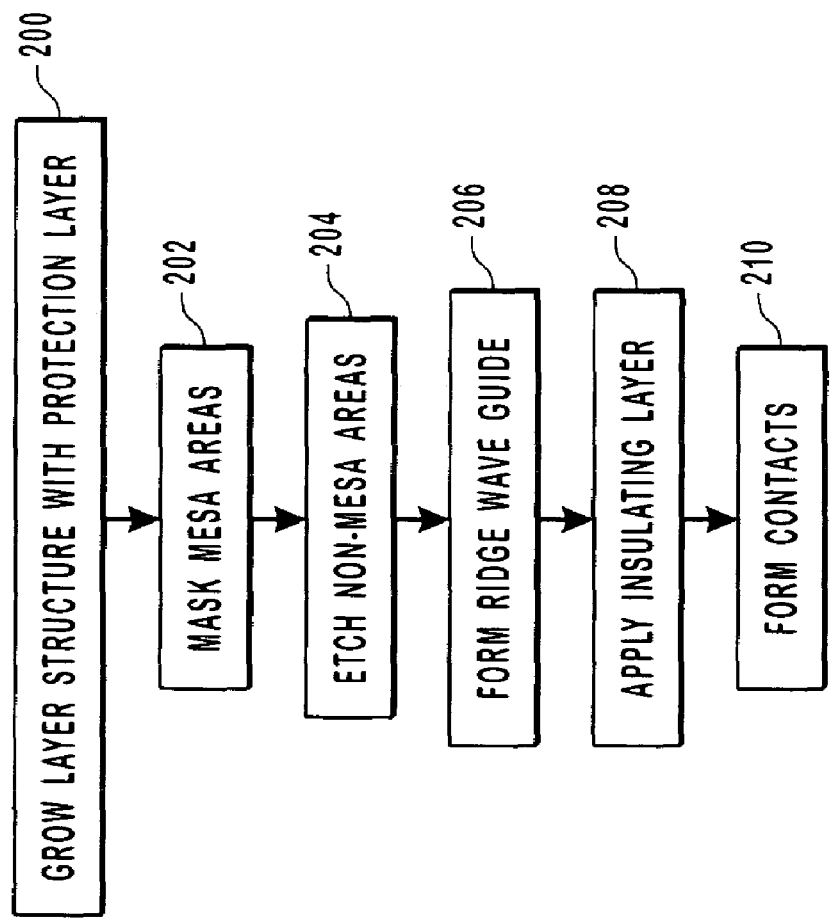
FIG. 5 is a flow chart representation of a fabrication process in accordance with one embodiment of the present invention.

FIG. 5 is a flow chart illustrating one method of fabricating a semiconductor laser in accord with the present invention. The described semiconductor laser is an InP/AlInGaAs type semiconductor, such as laser emitting in a wavelength range between about 1.3 to 1.6 microns. It will be understood by one skilled in the art, however, that other semiconductor lasers may be fabricated using the method of the present invention. For instance, Fabry-Perot and distributed feedback (DFB) lasers. Similarly, other types of optoelectronic devices having a semiconductor ridge waveguide may be fabricated using the methods of the present invention. Such devices may include, but are not limited to, semiconductor optical amplifiers, ridge waveguide semiconductor optical modulators, and photonic devices having combinations of ridge semiconductor lasers, ridge waveguide optical amplifiers, and ridge waveguide optical modulators.

Figure 6A:
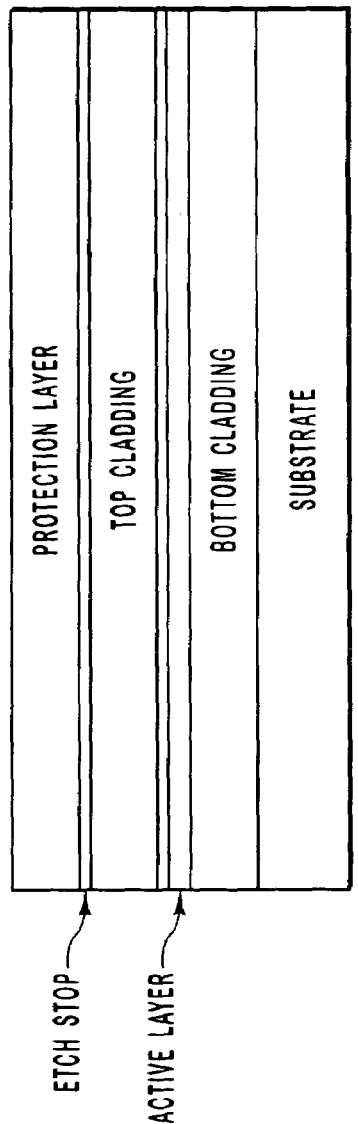
FIG. 6A is a side view illustrating a laser wafer including an additional semiconductor protection layer in accordance with one process of the present invention.

As an initial step, a laser structure is grown, as represented by block 200. This laser structure may be grown on a substrate and include (i) a bottom or first cladding layer, (ii) a multiple quantum well active layer, (iii) an quaternary AlInGaAs waveguiding layer(s), (iv) top or second cladding layers forming the ridge waveguide, (v) a heavily doped InGaAs etching stop layer or contact layer, and (vi) a protection layer grown over the InGaAs layer. The resultant structure is depicted in FIG. 6A.

In one embodiment, the protection layer has a thickness of about 2.0 microns, while the top cladding layers have a thickness of about 2.0 microns. The protection layer and etch stop layer may be doped. This doping may be p-type, such that protection layer and etch stop layer includes Zn doped layers. For lasers grown with the metalo-organic chemical vapor deposition (MOCVD) growth technique, the growth conditions and doping density of the growth sequence are preferably empirically adjusted to account for dopant diffusion during growth of the InP protection layer.

Figure 6B:
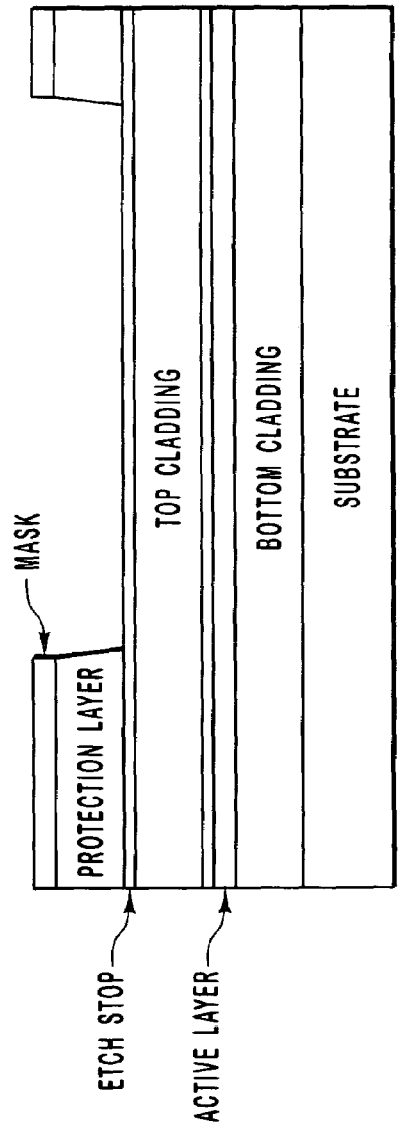
FIG. 6B is a side view illustrating a laser wafer including an additional semiconductor protection layer in areas of the wafer in which ridge waveguide lasers are to be formed in accordance with one process of the present invention.

After the wafer is grown, areas that are to be formed into the mesas are masked using photolithography to pattern a suitable mask, such as silicon oxide or silicon nitride, as represented by block 202. A selective wet chemical etch, such as 1 HCl:2H$_3$PO$_4$, is used to etch or remove the top or second cladding layer from the non-mesa areas, as represented by block 204 and depicted in FIG. 6B. The etching or removal process removes the protection layers down to the etch stop or contact layer.

While a selective etching technique may be used to etch the protection layer to form mesas 106, it will also be understood that other fabrication techniques may also be used. In particular, a selective area growth technique may be used to grow semiconductor mesas on top of a laser wafer. In MOCVD selective area growth (SAG) occurs when a mask, such as silicon dioxide, is patterned on a wafer and the MOCVD growth conditions are selected so that epitaxy occurs only in unmasked regions. Thus, another technique that may be used to form mesas 106 is to use a MOCVD SAG technique to form the desired mesas 106a–106n on top of a laser wafer.

Figure 6C:
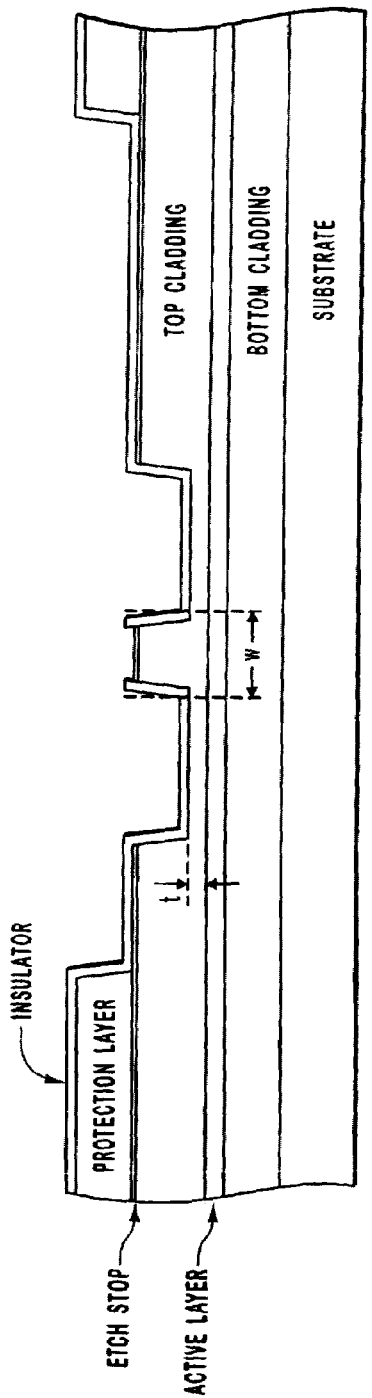
FIG. 6C is a side view illustrating a ridge waveguide patterned between protective mesas in accordance with one process of the present invention.
Figure 6D:
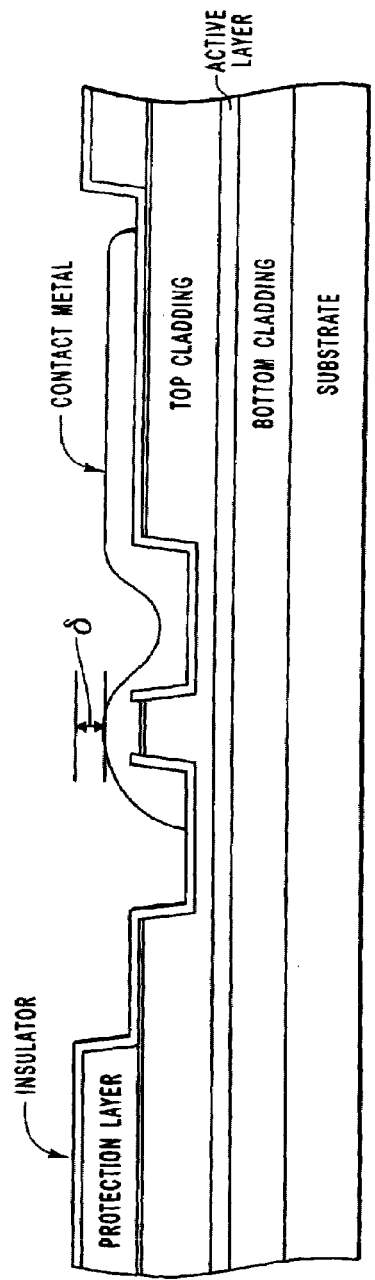
FIG. 6D illustrates a ridge waveguide laser with deposited contact metals in accordance with one process of the present invention.

Following the initial etching process, the ridge waveguide is formed by a dry etching process, or a wet etching process, or a combination of dry and wet etching processes, as represented by block 206. The ridge waveguide is etched, shown in FIG. 6C, so that the ridge waveguide has a base width w of about 2 microns. Similarly, a portion of the top or second cladding is removed to within about 1.7 micron about the active layer to form the ridge waveguide. The distance δ separating a top surface of the contact layer deposited on the ridge waveguide and a top surface of the protection mesas, shown in FIG. 6D, may have a value greater than 0.5 micron to provide sufficient protection of the waveguide ridge.

Figure 7:
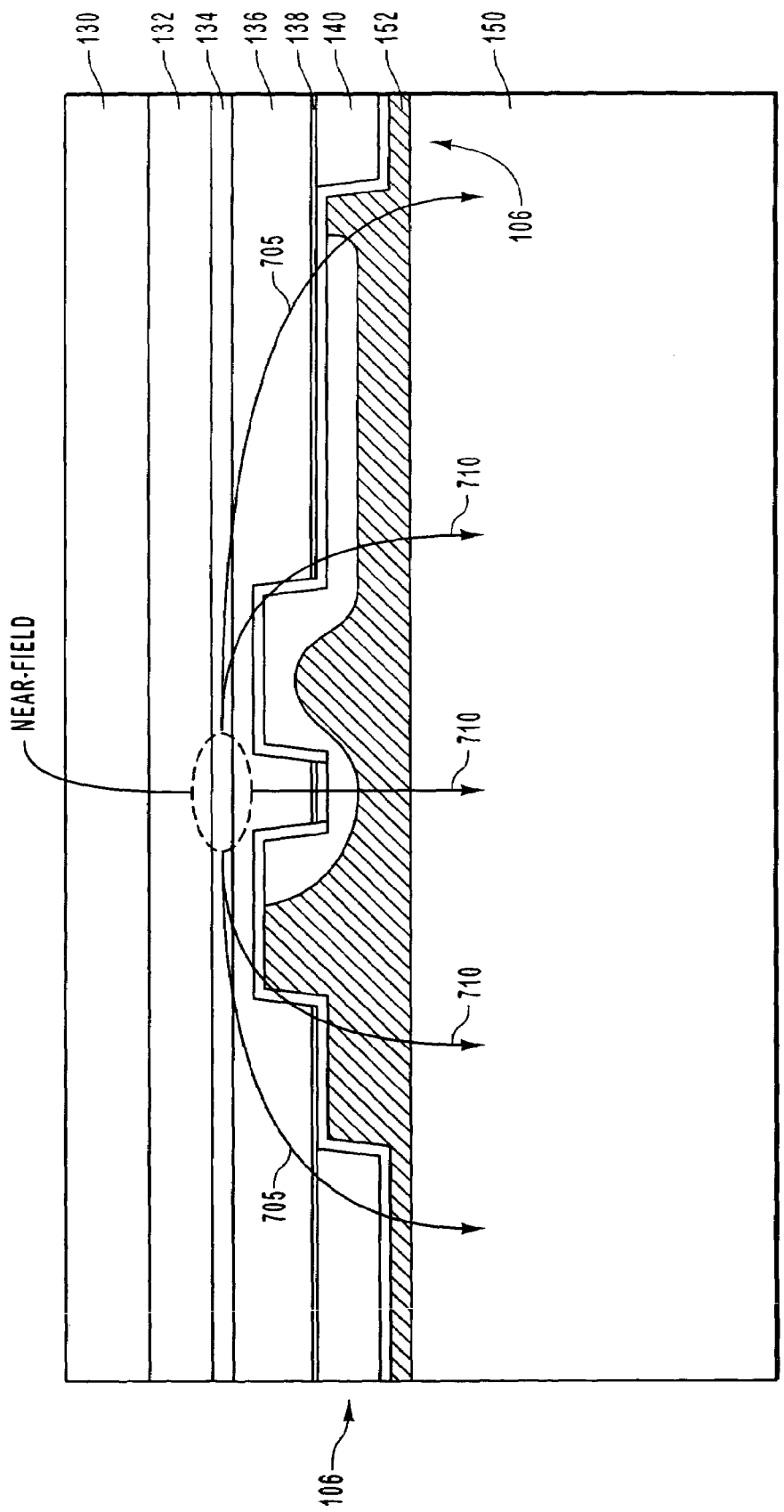
FIG. 7 illustrates a packaged ridge waveguide laser of the present invention and associated thermal and optical characteristics.

FIG. 7 is an illustrative side view of a ridge waveguide laser die, such as ridge waveguide laser die 102a mounted to a laser sub-mount or header 150 using a suitable solder or conductive epoxy 152. When laser 102a is operated, the light will be generated in a near-field region having a lateral width typically somewhat greater than that of ridge waveguide 108a. Heat generated in the active region flows vertically into sub-mount 150. Additionally, since mesas 106 are formed from a semiconductor, heat may also flow laterally following the path defined by arrows 154 into sub-mount 150 through mesas 106. Consequently, the ridge waveguides of the present invention will have a thermal resistance comparable to that of conventional ridge waveguide lasers. Moreover, since mesas 106 are a lattice matched semiconductor, protection layer 140 and its associated mesas 106 will not introduce deleterious stress. These characteristics make the ridge waveguide lasers of the present invention of interest for use in transceivers, where low thermal resistance and low stress are required to obtain an acceptable laser lifetime at high power levels.

The mesas 106 of the present invention may be applied to a variety of different laser structures, including, but not limited to, Fabry-Perot and distributed feedback (DFB) lasers. For a Fabry-Perot laser, only a single epitaxy step may be used. For instance, the step described with respect to FIG. 6A may be used. In the case of a DFB laser, however, a conventional grating fabrication and regrowth process may be used. For example, in one embodiment of a DFB laser a bottom or first cladding layer, an active layer, and thin spacer layer is formed. A grating is formed using holographic exposure or e-beam lithography and dry etching. Following this process, a conventional regrowth process forms a periodic refractive index profile close to the active layer, planarizes the surface, and forms a top or second cladding layer, InGaAs contact layer, and a protection layer. The protection layer may then be selectively etched down to the contact layer in unmasked regions to form mesas 106 as previously described. While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. An opto-electronic device having a first cladding layer separated from a second cladding layer by an active layer, said device comprising:
    a ridge waveguide formed from at least a portion of the top cladding layer, said ridge waveguide having a ridge top surface disposed from the active layer by a first distance;
    a semiconductor mesa fashioned from a protective layer separate from the top cladding layer, said semiconductor mesa having a mesa top surface disposed from the active layer by a second distance that is greater than said first distance; and
    a metal contact layer extending over at least a portion of said ridge waveguide and terminating short of the semiconductor mesa.

2. The device as recited in claim 1, wherein said ridge waveguide is disposed between a first channel and a second channel.

3. The device as recited in claim 1, wherein said metal contact layer extends into a boundary region that is located adjacent said semiconductor mesa.

4. The device as recited in claim 1, wherein said ridge waveguide in combination with said metal contact layer has a distance from the active layer less than said second distance.

5. The device as recited in claim 1, wherein said semiconductor mesa comprises InP.

6. The device as recited in claim 1, further comprising an etch stop layer interposed between said protective layer and said top cladding layer.

7. The device as recited in claim 1, wherein the opto-electronic device is a device selected from the group consisting of a Fabry-Perot laser, a DFB laser, an optical modulator, and a semiconductor optical amplifier.

8. A semiconductor laser, the laser comprising:
    a semiconductor laser wafer having an active layer, at least two optical cladding layers, and a ridge waveguide, said ridge waveguide having a ridge top surface disposed from a first surface of said semiconductor laser wafer by a first distance;
    a plurality of semiconductor mesas formed on said semiconductor laser wafer, each of said plurality of semiconductor mesas being separated from said at least two optical cladding layers and having a mesa top surface disposed from said first surface by a second distance greater than said first distance;
    an insulating film disposed on a portion of said ridge waveguide and on said semiconductor mesas; and
    a metal contact layer that covers at least a portion of said ridge waveguide, said metal contact layer terminating short of said semiconductor mesas such that respective portions of said semiconductor mesas are uncovered by said metal contact layer.

9. The laser as recited in claim 8, wherein said metal contact layer extends from a channel located adjacent to said ridge waveguide into a boundary layer located adjacent to one of said semiconductor mesas.

10. The laser as recited in claim 8, wherein said ridge waveguide in combination with said metal contact has a third distance from said first surface less than said second distance.

11. The laser as recited in claim 8, wherein said metal contact has a thickness of less than about one micron.

12. The laser as recited in claim 8, wherein said second distance is at least 0.5 micron greater than said first distance.

13. The laser as recited in claim 8, wherein at least one of said plurality of semiconductor protective layer has a thickness of between about 1.5 microns and 3.0 microns.

14. A laser die having an active layer disposed between a first cladding layer and a second cladding layer, the laser die comprising:
    a doped semiconductor contact layer disposed on the first cladding layer;
    a ridge waveguide that includes a portion of said semiconductor contact layer, said ridge waveguide having a ridge top surface disposed from a first surface of the laser die by a first height;
    a metal contact layer extending over said ridge waveguide; and
    a semiconductor mesa formed on said semiconductor contact layer, said semiconductor mesa extending a distance above a top surface of said metal contact layer to form an elevated surface, and said semiconductor mesa arranged such that said metal contact layer terminates short of said semiconductor mesa.

15. A laser die as recited in claim 14, wherein said at least one semiconductor mesa comprises InP.

16. A laser die as recited in claim 14, wherein the first cladding layer and the second cladding layer comprises materials selected from the group consisting of III-V semiconductor material.

17. A laser die as recited in claim 14, wherein said elevated surface is elevated from said metal contact layer disposed on said ridge waveguide by at least about 0.5 micron.

18. A laser die as recited in claim 14, wherein the die has a peripheral edge and said semiconductor contact layer terminates proximal to said peripheral edge of the laser die.

19. The device as recited in claim 1, further comprising an insulating layer extending over at least one of the mesas, and further extending over a portion of the ridge waveguide.

20. The semiconductor laser as recited n claim 8, wherein part of the insulating film is located beneath the metal contact layer.

21. The laser die as recited in claim 14, further comprising an insulating film extending over said semiconductor mesa, and further extending over a portion of the ridge waveguide.

* * * * *